United States Patent
Lin et al.

(10) Patent No.: US 7,924,193 B2
(45) Date of Patent: Apr. 12, 2011

(54) ALL-DIGITAL SPREAD SPECTRUM CLOCK GENERATOR

(75) Inventors: Sheng-You Lin, Taipei (TW); Shen-Iuan Liu, Taipei (TW)

(73) Assignee: National Taiwan University, Taipei (TW)

( * ) Notice: Subject to any disclaimer, the term of this patent is extended or adjusted under 35 U.S.C. 154(b) by 14 days.

(21) Appl. No.: 12/549,320

(22) Filed: Aug. 27, 2009

(65) Prior Publication Data

US 2011/0006936 A1    Jan. 13, 2011

(30) Foreign Application Priority Data

Jul. 9, 2009 (TW) .............................. 98123186 A

(51) Int. Cl.
*H03M 3/00*    (2006.01)
(52) U.S. Cl. ........................................ 341/143; 341/155
(58) Field of Classification Search .................. 341/118, 341/143, 120, 144, 155; 331/18; 327/146, 327/147
See application file for complete search history.

(56) References Cited

U.S. PATENT DOCUMENTS

| | | | |
|---|---|---|---|
| 7,570,182 B2 * | 8/2009 | Sheba et al. | 341/118 |
| 7,583,152 B2 * | 9/2009 | Zhang | 331/25 |
| 7,791,385 B2 * | 9/2010 | Huang et al. | 327/160 |

* cited by examiner

*Primary Examiner* — Brian Young
(74) *Attorney, Agent, or Firm* — Wang Law Firm; Li K. Wang

(57) ABSTRACT

An embodiment of the invention relates to an all-digital spread spectrum clock generator comprising a phase detector, a time-to-digital converting unit, a digital loop filter, a delta-sigma modulator and a digital controlled oscillator. The phase detector receives a reference signal and a clock feedback signal to output first and second difference signals. The time-to-digital converting unit comprises timing amplifier to receive and amply the first and second difference signals to generate digital data. The digital loop filter receives and accumulates digital data to output first and second digital data. The delta-sigma modulator receives the second digital data to generate a resolution tuning word. The digital controlled oscillator adjusts its frequency of output clock signal according to the first difference signal, the second difference signal and the first digital data, and adjusts a resolution of the digital controlled oscillator according to the resolution tuning word.

15 Claims, 7 Drawing Sheets

ALL-DIGITAL SPREAD SPECTRUM CLOCK GENERATOR

CROSS REFERENCE TO RELATED APPLICATIONS

This Application claims priority of Taiwan Patent Application No. 098123186, filed on Jul. 9, 2009, the entirety of which is incorporated by reference herein.

BACKGROUND OF THE INVENTION

1. Field of the Invention

The present invention relates to a spread spectrum clock generator, and in particular relates to an all-digital spread spectrum clock generator.

2. Description of the Related Art

Serial Advanced Technology Attachment (SATA) is widely used in internal storage interconnection for giga-bit-per-second data rate operating at high data rates; the high-frequency clock causes electromagnetic interference (EMI) which may affect the wireless communication systems. Accordingly, there are several techniques which have been presented to suppress the EMI, such as a frequency modulation (FM), pulse swallow technique, phase interpolation, digital delay line modulation, and delta-sigma modulation. Among these techniques, the delta-sigma modulation based fractional-N frequency synthesizer is becoming a popular one, because it is almost digitally realized and has a better EMI reduction performance.

BRIEF SUMMARY OF THE INVENTION

An embodiment of the invention provides an all-digital spread spectrum clock generator. The all-digital spread spectrum clock generator comprises a phase detector, a time-to-digital converting unit, a digital loop filter, a delta-sigma modulator and a digital controlled oscillator. The phase detector receives a reference signal and a clock feedback signals To output a first difference signal and a second difference signal. The time-to-digital converting unit comprises a timing amplifier to receive and amply the first difference signal and the second difference signal to generate a digital data. The digital loop filter receives and accumulates the digital data to output a first digital data and a second digital data. The delta-sigma modulator receives the second digital data to generate a resolution tuning word. The digital controlled oscillator adjusts the frequency of an output clock signal of the digital controlled oscillator according to the first difference signal, the second difference signal and the first digital data, and adjust a resolution of the digital controlled oscillator according to the resolution tuning word.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
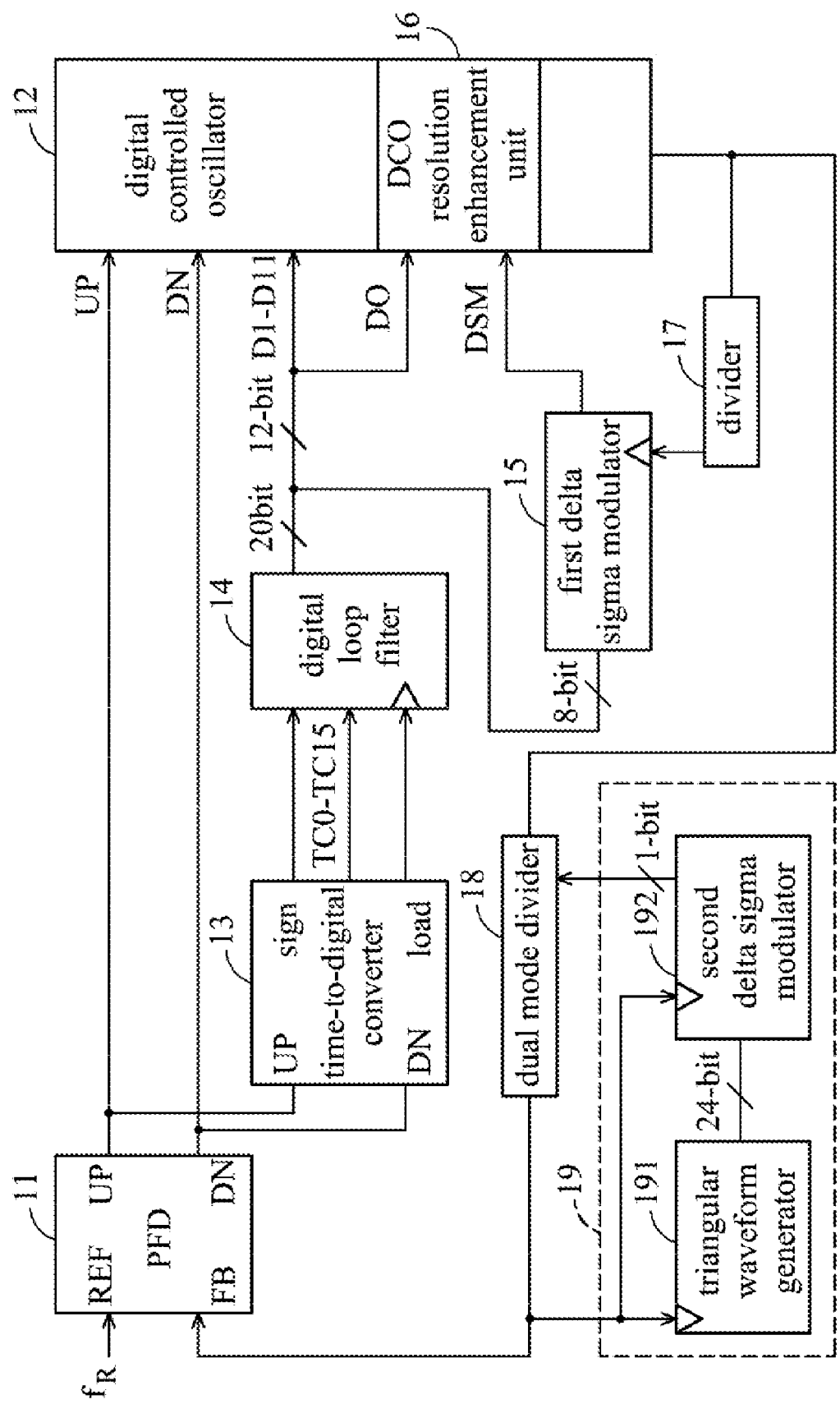
FIG. 1 is a schematic diagram of an embodiment of an all-digital spread spectrum clock generator (ADSSCG) according to the invention.

FIG. 1 is a schematic diagram of an embodiment of an all-digital spread spectrum clock generator (ADSSCG) according to the invention. The all-digital spread spectrum clock generator comprises a mixed-mode phase detector which is composed of a phase and frequency detector 11 and a time-to-digital converter 13. The phase and frequency detector 11 receives an input signal $f_R$ and a feedback signals To output and transmit a first differential signal and a second differential signal to the time-to-digital converter 13 and digital controlled oscillator 12. The time-to-digital converter 13 receives the first differential signal UP and the second differential signal DN to output an output signal via the output terminal sign to indicate the phase relation (lead or lag) of the input signal $f_R$ and the feedback signal. The time-to-digital converter 13 further outputs clock signals TC0~TC15 via the output terminal load to inform the digital loop filter 14 for receiving and counting the clock signals TC0~TC15.

In this embodiment, when the phase error is very small, the D flip-flops (not shown in FIG. 1) inside the phase and frequency detector 11 and time-to-digital converting unit 13 may output an error result. Therefore, the all-digital spread spectrum clock generator of FIG. 1 uses a time amplifier which is coupled to the input terminals of the D flip-flops to amplify the phase error so that the D flip-flops does not output an error result.

The digital loop filter 14 comprises a 20-bit accumulator to accumulate the clock signals TC0~TC12 to output a 20-bit data, wherein the 20-bit data is divided into a 12-bit data and an 8-bit data. The 8-bit data is transmitted to a first delta sigma modulator (DSM) 15 and the first delta sigma modulator 15 outputs a resolution tuning word DSM to the digital controlled oscillator resolution enhancement unit 16 to adjust the resolution of the digital controlled oscillator 12 according to a second clock signal output from the divider 17.

The bits D0~D11 is the first 12 bit output from the digital loop filter 14. The bit D0 is transmitted to the first delta sigma modulator 15 to adjust the resolution of the digital controlled oscillator 12. The bits D1~D11 is used to adjust the frequency of the output clock signal of the digital controlled oscillator 12. The bits D1~D11 also overcomes the PVT (process, voltage and temperature) variations during the manufacturing of the digital controlled oscillator 12 to reduce the non-ideality thereof.

The modulation controller 19 outputs a control signal to the dual mode divider 18 to control the divisor (divider ratio) thereof. In this embodiment, the dual mode divider 18 has two divisors, 59 and 60. The output clock of the digital controlled oscillator 12 is divided by 59 or 60 according to the output signal of the second delta sigma modulator 192. The dual mode divider 18 receives and divides the frequency of the output clock of the digital controlled oscillator 12 to generate a first clock signal. The first clock signal is input to the input terminal FB of the phase and frequency detector 11 to be served as the feedback signal of the phase and frequency detector 11. The modulation controller 19 comprises a triangular waveform generator 191 and the second delta sigma modulator 192. The second delta sigma modulator 192 is a 24-bit first-order DSM. The triangular waveform generator 191 generates and transmits 24-bit data according to the first clock signals to the second delta sigma modulator 192. In this embodiment, the triangular waveform generator 191 may be implemented by a finite state machine.

To meet SATA requirements, the frequency of the triangular wave output by the triangular waveform generator 191 is 31 KHz, the frequency of the output clock signal of the digital controlled oscillator 12 is within the range between 1.4925 GHz and 1.5 GHz, and the amplitude of the output clock signal of the digital controlled oscillator 12 is 5000 ppm. The ideal divisor is 59.7, and the dual mode divider 18 therefore provides two divisors, 59 and 60, for adaptively calibrating the frequency of the output clock signal of the digital controlled oscillator 12. Furthermore, the frequency of the reference signal $f_R$ is 25 MHz.

Figure 2:
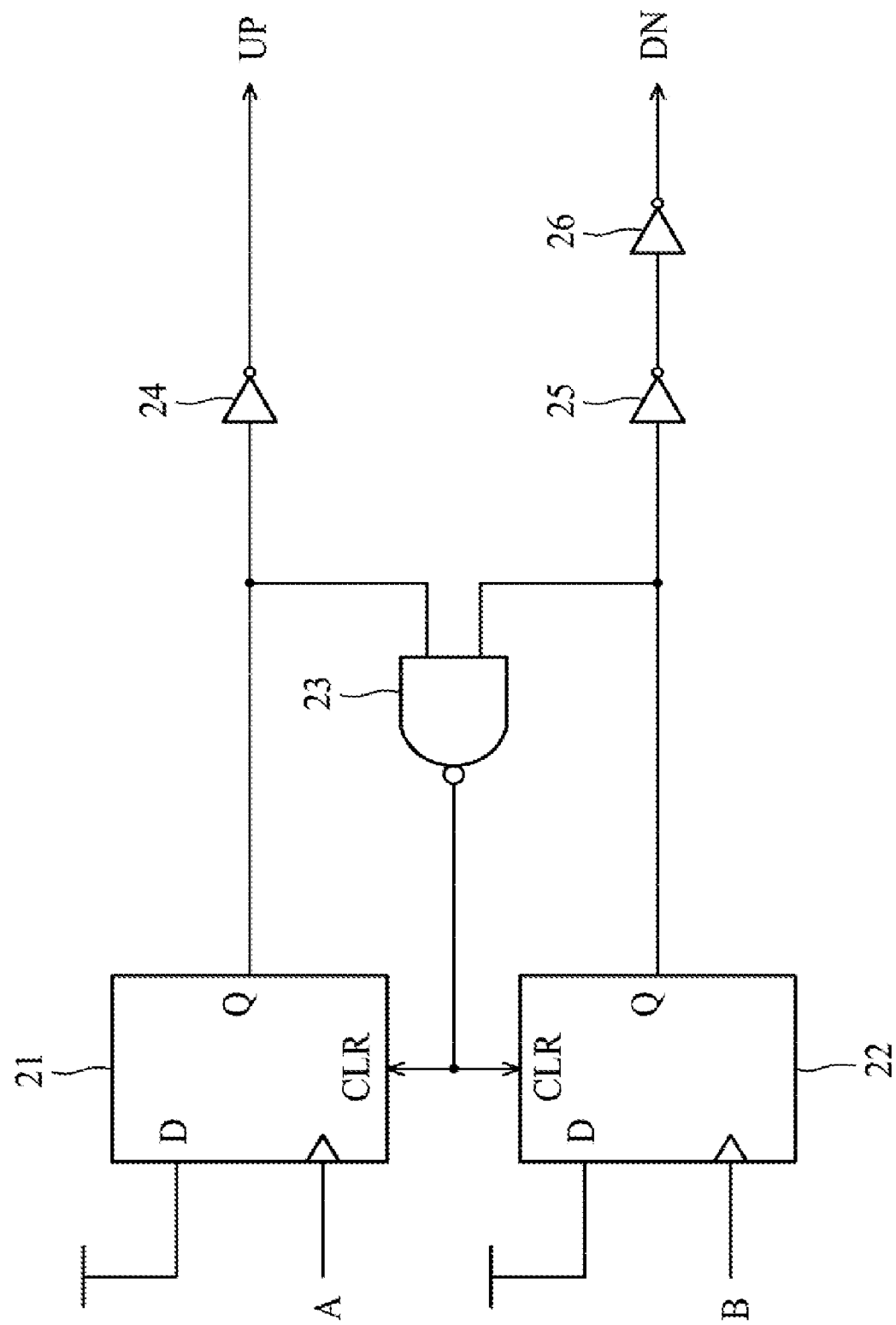
FIG. 2 is a schematic diagram of an embodiment of phase and frequency detector according to the invention.

FIG. 2 is a schematic diagram of an embodiment of phase and frequency detector according to the invention. In this embodiment, the phase and frequency detector receives input signals A and B and outputs corresponding differential signals UP and DN. One example of the input signals A and B is the reference signal $f_R$ and feedback signal of FIG. 1. The data input terminal (D terminal) of the D flip-flop 21 is grounded and the clock input terminal of the D flip-flop 21 receives signal A. The data input terminal (D terminal) of the D flip-flop 22 is grounded and the clock input terminal of the D flip-flop 22 receives signal B. The output signals of the D flip-flops 21 and 22 are transmitted to the NAND gate 23 to output a reset signal to the D flip-flops 21 and 22. The differential signal UP is generated by inputting the output signal of the D flip-flop 21 through the inverter 24. The differential signal DN is generated by inputting the output signal of the D flip-flop 21 through the inverters 25 and 26. The differential signals UP and DN control an integer path gain of the all-digital spread spectrum generator and the integer path gain can be adjusted by controlling the capacitance of the varactor. For further illustration, please refer to FIG. 3.

Figure 3:
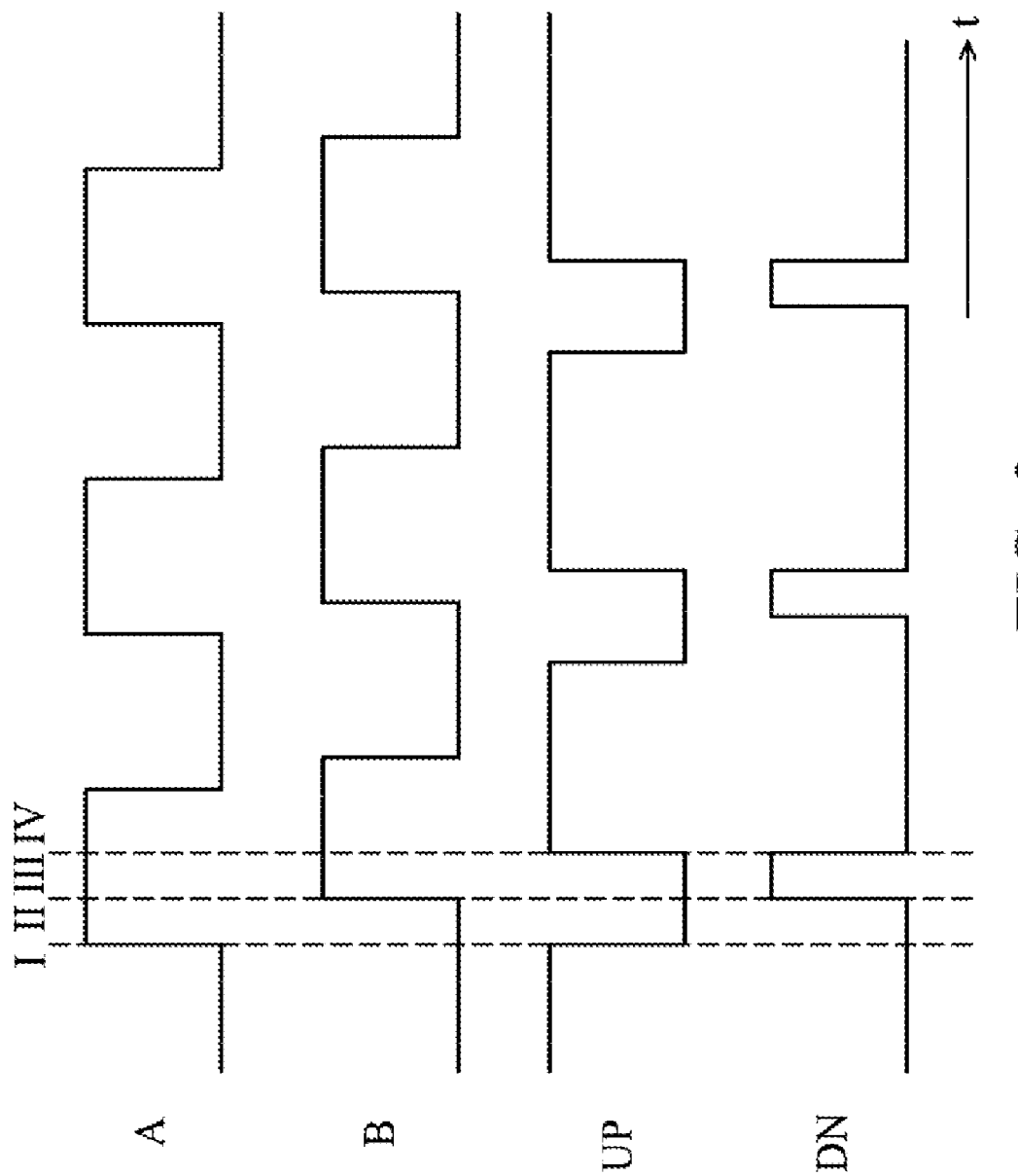
FIG. 3 is a timing diagram of the phase and frequency detector of FIG. 2, wherein signal A leads signal B.

FIG. 3 is a timing diagram of the phase and frequency detector of FIG. 2, wherein signal A leads signal B. At time period I, the signals A and B are at low voltage level, the differential signal UP is at high voltage level, i.e., logic "1", and the differential signal DN is at low voltage level. At time period II, the signal A is pulled to a high voltage level and the signal B is maintained at low voltage level. Thus, the frequency of the output clock signal of the digital controlled oscillator increases, and both the differential signals UP and DN are at low voltage levels, i.e., logic "0". At time period III, the signal B is pulled to a high voltage level, and the differential signals UP and DN are also pulled to a high voltage level. At time period III, the D flip-flops 21 and 22 are reset. After the D flip-flops 21 and 22 are reset, the state of differential signals DN and UP at time period IV is returned to the state at time period I.

If signal B leads to signal A, then the differential signals DN and UP are set to logic "1" to reduce the frequency of the output clock signal of the digital controlled oscillator. When signal A is changed from logic "0" to logic "1", the differential signal UP is maintained at logic "1" and signal DN is changed to logic "0". In this embodiment, the control pulse width is proportional to the phase error. Therefore, the quantization noise contributed by the proportional path PFD is degraded and the linearity of proposed PFD is enhanced.

Figure 4:
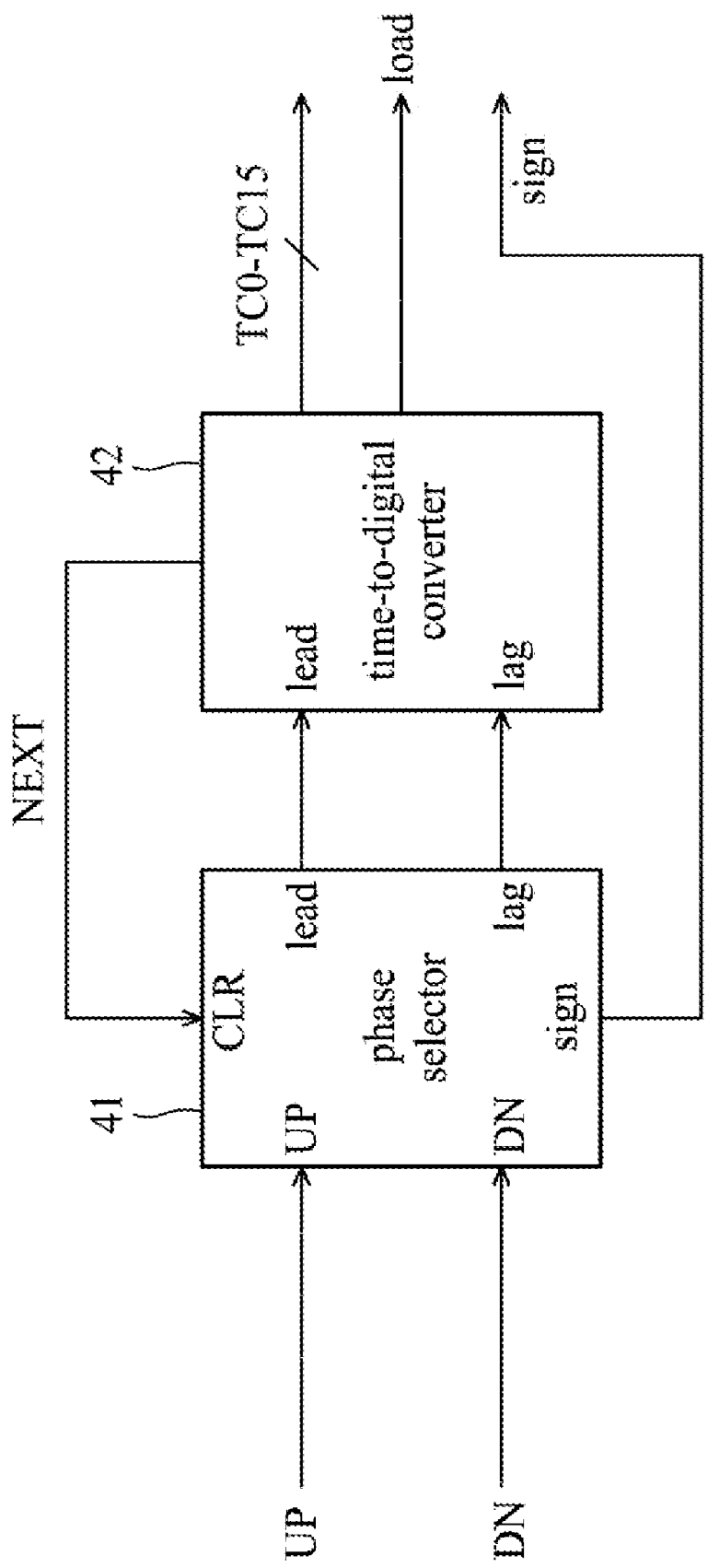
FIG. 4 is a schematic diagram of an embodiment of a time-to-digital converting unit according to the invention.

FIG. 4 is a schematic diagram of an embodiment of a time-to-digital converting unit according to the invention. The time-to-digital converting unit comprises a phase selector 41 and a time-to-digital converter (TDC) 42. The TDC 42 is a 5-bit Vernier TDC. The 5-bit Vernier TDC 42 can convert the phase difference between the signals UP and DN to digital codes and can't determine which of the signal is leading or lagging. Therefore, a phase selector 41 is implemented to determine the phase relation between the signals UP and DN and sends the signals UP and DN to TDC 41.

Figure 5:
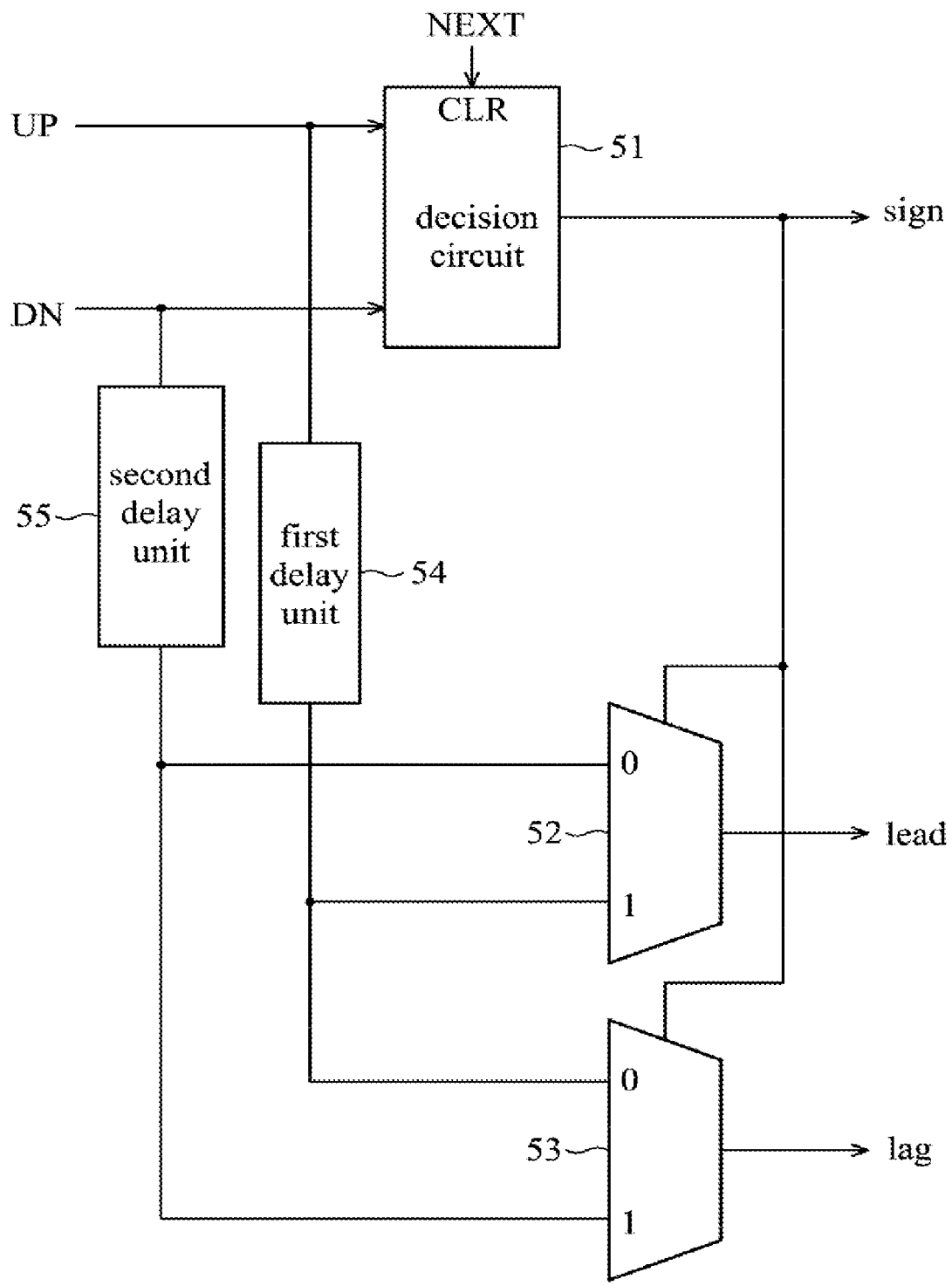
FIG. 5 is a schematic diagram of an embodiment of the phase selector according to the invention.

FIG. 5 is a schematic diagram of an embodiment of the phase selector according to the invention. The phase selector comprises a decision circuit 51, multiplexers 52 and 53, a first delay unit 54 and a second delay unit 55. The first delay unit 54 is coupled to the multiplexer 52 to delay the differential signal UP for a delay time ΔT. The second delay unit 55 is coupled to the multiplexer 53 to delay the differential signal DN for a delay time ΔT. Before each phase comparison, the signal NEXT from the TDC 42 will reset the sign signal to one. If the signal DN leads, the output of decision circuit 51 will output logic one. The differential signals DN and UP will be transferred to the lead terminal and the lag terminal of the TDC 42 by the multiplexers 52 and 53, respectively. If the signal UP leads, the output of the decision circuit 51 will output logic zero. The differential signals UP and DN will be transferred to the lead terminal and lag terminal of the TDC 42 by the multiplexers 52 and 53, respectively. Therefore, the two delay units 54 and 55 are inserted between the input and the multiplexers 52 and 53 to wait signal sign for duration ΔT and the duration ΔT should longer than the setup time of decision circuit 51, the multiplexers 52 and 53.

Figure 6:
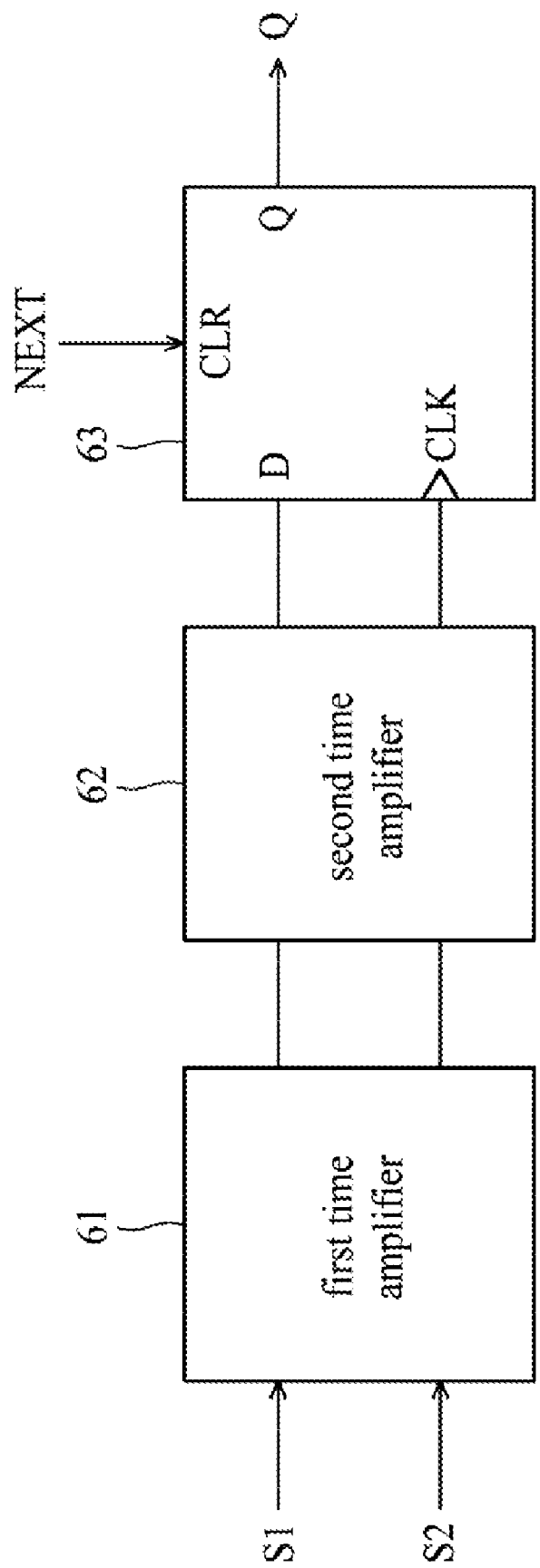
FIG. 6 is a schematic diagram of an embodiment of the decision circuit according to the invention.

FIG. 6 is a schematic diagram of an embodiment of the decision circuit according to the invention. Normally, D flip-flops (DFF) are used as phase decision circuits. When the phase error is very small, the DFF operates in the deadzone and outputs results containing errors. In this embodiment, the DFF is replaced by a decision circuit. The decision circuit comprises a first time amplifier 61, a second time amplifier 62 and a D flip-flop 63. Time amplifiers 61 and 62 enlarge the input phase difference, so that the deadzone duration of DFF is equivalently degraded. If the first time amplifier 61 which has a gain of $A_{TA}$ is cascaded to the DFF, the deadzone duration of the DFF, $T_{DZ}$, will become $T_{DZ}/A_{TA}$. The first time amplifier 61 and second time amplifier 62 can provide a gain of about 14 and if the first time amplifier 61 and second time amplifier 62 are cascaded, the two-cascaded time amplifiers provide a gain of around 200.

Figure 7:
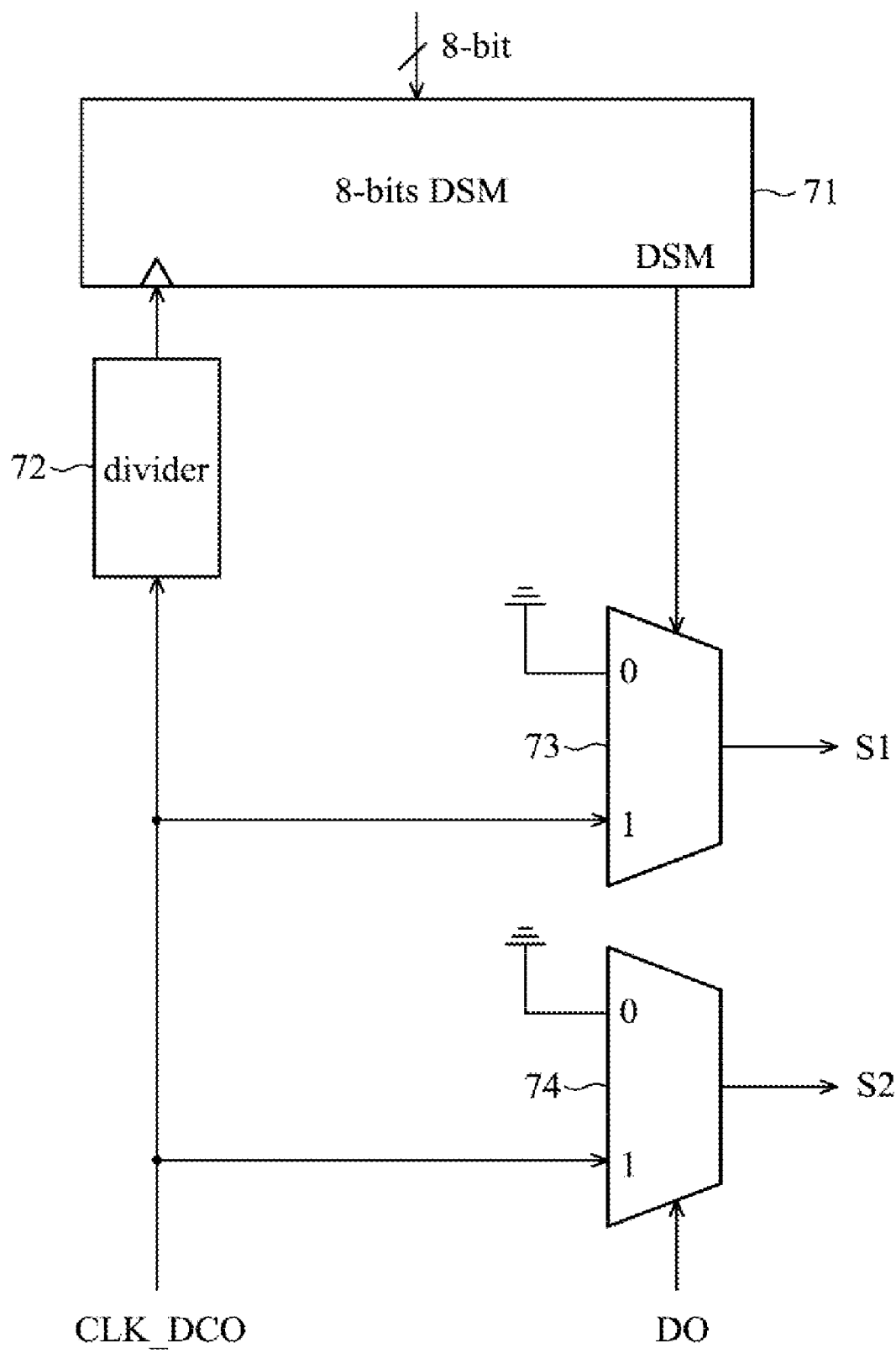
FIG. 7 is a schematic diagram of an embodiment of the digital controlled oscillator resolution enhancement unit according to the invention.

FIG. 7 is a schematic diagram of an embodiment of the digital controlled oscillator resolution enhancement unit according to the invention. The principle of the resolution enhancement unit is to utilize the high frequency output clock to dither a unit PMOS of the PMOS array to increase the resolution of the digital controlled oscillator (DCO). The 8-bit DSM, controlled by a clock signal from the divider 72, receives the 8-bit data from the digital loop filter to output the resolution tuning word DSM. The divider 72 receives and frequency divides the frequency of the output clock signal $CLK_{DCO}$ of the digital controlled oscillator. In this embodiment, the divider 72 divides the frequency of the output clock signal $CLK_{DCO}$ by 4. The multiplexer 73 is controlled by the resolution tuning word DSM to output the control signal S1. If DSM is 1, the unit PMOS is switched between on and off by the output clock. Thus, the frequency gain of the unit PMOS is halved. The operation of the multiplexer 74 is similar to the multiplexer 73. Note that the unit PMOS controlled by the control signal S1 is different from the unit PMOS controlled by the control signal S2, and thus the performance of the DCO resolution enhancement is accordingly better.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An all-digital spread spectrum clock generator, comprising:
    a phase detector to receive a reference signal and a clock feedback signal to output a first difference signal and a second difference signal;
    a time-to-digital converting unit comprising a timing amplifier to receive and amplify the first difference signal and the second difference signal to generate a digital data;
    a digital loop filter to receive and accumulate the digital data to output a first digital data and a second digital data;
    a delta-sigma modulator receiving the second digital data to generate a resolution tuning word; and
    a digital controlled oscillator to adjust a frequency of an output clock signal of the digital controlled oscillator according to the first difference signal, the second difference signal and the first digital data, and adjust a resolution of the digital controlled oscillator according to the resolution tuning word.

2. The all-digital spread spectrum clock generator as claimed in claim 1, further comprising:
    a divider receiving and dividing the output clock signal to generate and transmit a first clock signal to the delta-sigma modulator, wherein the delta-sigma modulator generates the resolution tuning word according to the first clock signal.

3. The all-digital spread spectrum clock generator as claimed in claim 1, further comprising:
    a dual mode divider having a first divisor and a second divisor, to select the first divisor or the second divisor according to a control signal for dividing the output clock signal to generate the clock feedback signal according to the selected first divisor or the second divisor.

4. The all-digital spread spectrum clock generator as claimed in claim 3, wherein the first divisor is 59 and the second divisor is 60.

5. The all-digital spread spectrum clock generator as claimed in claim 3, further comprising a modulation controller to generate the control signal according to the clock feedback signal.

6. The all-digital spread spectrum clock generator as claimed in claim 5, wherein the modulation controller comprises:
    a triangular waveform generator to generate a first digital data according to the clock feedback signal; and
    a second delta-sigma modulator receiving the first digital data to generate the control signal.

7. The all-digital spread spectrum clock generator as claimed in claim 1, wherein the time-to-digital converting unit further comprises:
    a phase selector receiving the first difference signal and the second difference signal to generate a first signal and a second signal; and
    a time-to-digital converter receiving the first signal and the second signal to generate the digital data and a load signal.

8. The all-digital spread spectrum clock generator as claimed in claim 7, wherein the time-to-digital converter output a first control signal to reset the phase selector.

9. The all-digital spread spectrum clock generator as claimed in claim 8, wherein the phase selector is reset by the first control signal before the phase selector compares the phase between the difference signal and the second difference signal, and the phase selector outputs an indication signal.

10. The all-digital spread spectrum clock generator as claimed in claim 9, wherein the digital loop filter further operates according to the load signal and the indication signal.

11. The all-digital spread spectrum clock generator as claimed in claim 7, wherein the phase selector comprises:
    a decision circuit comprising a first input terminal receiving the first difference signal and a second input terminal receiving the second difference signal to generate an indication signal, and the decision circuit is reset according to the first control signal;
    a first delay unit comprising a first terminal coupled to the first input terminal, and a second terminal;
    a second delay unit comprising a first terminal coupled to the second input terminal and a second terminal;
    a first multiplexer comprising a third input terminal coupled to the second terminal of the first delay unit, and a fourth input terminal coupled to the second terminal of the second delay unit; and
    a second multiplexer comprising a fifth input terminal coupled to the second input terminal and a second terminal, and a sixth input terminal coupled to the second terminal of the first delay unit, wherein the first multiplexer and the second multiplexer output signals according to the indication signal.

12. The all-digital spread spectrum clock generator as claimed in claim 11, wherein the first delay unit and the second delay unit have a delay time and the delay time is larger than a reset time of the decision circuit.

13. The all-digital spread spectrum clock generator as claimed in claim 11, wherein the decision circuit comprises:
    a first time amplifier receiving and amplifying the first difference signal and the second difference signal to generate a third difference signal and a fourth difference signal; and
    a D flip-flop to generate the indication signal according to the third difference signal and the fourth difference signal.

14. The all-digital spread spectrum clock generator as claimed in claim 13, wherein the D flip-flop is controlled by the first control signal and when the first control signal is at a first logic level, the D flip-flop is reset.

15. The all-digital spread spectrum clock generator as claimed in claim 13, wherein the decision circuit further comprises a second time amplifier coupled between the first time amplifier and the D flip-flop.

* * * * *